United States Patent [19]
Henry

[11] Patent Number: 6,040,718
[45] Date of Patent: Mar. 21, 2000

[54] MEDIAN REFERENCE VOLTAGE SELECTION CIRCUIT

[75] Inventor: Paul M. Henry, Tucson, Ariz.

[73] Assignee: National Semiconductor Corporation, Santa Clara, Calif.

[21] Appl. No.: 08/990,561

[22] Filed: Dec. 15, 1997

[51] Int. Cl.[7] .................................................. H03K 5/22
[52] U.S. Cl. ............................ 327/71; 327/407; 327/408
[58] Field of Search .................................. 327/68, 62, 71, 327/82, 407, 408, 545, 546; 307/64, 65, 85, 86

[56] References Cited

U.S. PATENT DOCUMENTS

| | | | |
|---|---|---|---|
| 3,619,791 | 11/1971 | Moreines | 327/70 |
| 4,341,961 | 7/1982 | Komoriya | 327/58 |
| 4,460,837 | 7/1984 | Anderson, Jr. | 327/68 |
| 4,617,473 | 10/1986 | Bingham | 307/66 |
| 4,626,707 | 12/1986 | Arita et al. | 327/66 |
| 4,654,829 | 3/1987 | Jiang et al. | 365/229 |
| 5,130,582 | 7/1992 | Ishihara et al. | 327/262 |
| 5,283,762 | 2/1994 | Fujishima | 365/189.09 |

*Primary Examiner*—Terry D. Cunningham
*Attorney, Agent, or Firm*—Skjerven Morrill MacPherson Franklin & Friel LLP; Barmak S. Sani

[57] ABSTRACT

A comparator circuit performs at least three compare operations, wherein in each compare operation the comparator compares two of at least three reference voltages to one another and provides a signal to indicate which of the two reference voltages is greater. A decode logic circuit in response to the signals provided by the comparator circuit in the at least three compare operations selects the median reference voltage from among the at least three reference voltages, and causes a multiplexer to transfer the median reference voltage to an output terminal of the mux.

13 Claims, 7 Drawing Sheets

| Q1<br>(VR$_A$ > VR$_B$) | Q2<br>(VR$_A$ > VR$_C$) | Q3<br>(VR$_B$ > VR$_C$) | A | B | C |
|---|---|---|---|---|---|
| 0 | 0 | 0 | 0 | 1 | 0 |
| 0 | 0 | 1 | 0 | 0 | 1 |
| 0 | 1 | 0 | — | — | — |
| 0 | 1 | 1 | 1 | 0 | 0 |
| 1 | 0 | 0 | 1 | 0 | 0 |
| 1 | 0 | 1 | — | — | — |
| 1 | 1 | 0 | 0 | 0 | 1 |
| 1 | 1 | 1 | 0 | 1 | 0 |

MEDIAN REFERENCE VOLTAGE SELECTION CIRCUIT

BACKGROUND

1. Field of the Invention

The invention relates to a structure of and a method for identifying the median reference voltage from among a group of reference voltages generated by bandgap reference circuits.

2. Description of Related Art

Bandgap reference circuits have been used to generate a reference voltage that remains substantially constant in the face of temperature variations. This is accomplished by adding a voltage that is "proportional to absolute temperature" (which has a positive temperature coefficient) to the negative temperature coefficient voltage of a bipolar diode (Vbe).

The critical factor in achieving a temperature insensitive reference voltage, is to add the correct amount of "proportional to temperature" voltage to the negative temperature coefficient base-emitter voltage (Vbe). Typically, the ratio of the positive temperature coefficient voltage to the negative temperature coefficient voltage is set by selecting proper resistor ratios and emitter area ratios of two bipolar diodes in the bandgap reference circuit.

Even with proper ratios selected, A few sources of error exist which cause the characteristics of the band gap reference voltage to deviate from that designed for. Such deviation is more apparent when identically designed multiple bandgap reference circuits are incorporated in the same chip or in multiple chips. Generally, the causes of variations between multiple bandgap reference voltages fall within one of two categories. One category includes those causes which result in a normal distribution, such as that shown in FIG. 1a. FIG. 1a depicts the typical bell-shaped distribution among five reference voltages $VR_1-VR_5$, attributable to expected variations in the manufacturing process. These expected manufacturing variations cause mismatches among, for example, matching resistors, diodes and MOSFET devices.

The second category of causes is referred to as the "special causes". These causes are due to unexpected variations in the manufacturing process or other processes such as the assembly process. Among these causes are, particle defects, masking variations (misalignments), and photoresist tears, all of which can randomly cause the above-mentioned ratios to deviate from the target. The "special causes" result in reference voltages that significantly deviate from the "true" center of the distribution.

Combining these two categories of causes results in a distribution of reference voltages that looks like a normal distribution but with excessive population in the tails of the distribution, as shown in FIG. 1b. Any anomalistic or highly deviant reference voltages (such as $VR_1$ or $VR_3$) swings the average away from the "true" center of the distribution. This is especially true with smaller samples of reference voltages. These anomalistic or deviant units result in yield loss.

In the case of normal distribution (FIG. 1a), making the critical devices larger serves to reduce the impact of the category one causes by the square root of the area increase (i.e., increasing the area by four reduces the sigma of the distribution by two). But, such increases in devices result in larger silicon consumption and are also ineffective in reducing the impact of category two causes.

Trimming techniques at wafer level are used to improve the yield loss caused by the two categories of causes. Trimmable circuit components allow fine tuning of the reference voltage and the temperature characteristics of the bandgap circuit at wafer level. Two most popular trimming techniques are zener zapping and thin film laser trimming. Zener zapping does not work with modern fine line CMOS processes due to the use of barrier metal systems. Laser trimming of resistors requires the addition of thin film resistor process which is expensive, and the thin film process steps often conflict with fine line CMOS processes. Also, the process of laser trimming is itself slow and expensive.

Even though the wafer level trimming techniques help narrow the wide distribution due to the two categories of causes, the subsequent packaging process can cause the trimmed voltage distribution to spread widely, thereby causing yield loss at the package level. It is well known in the semiconductor art that the packaging process (whereby the wafer is cut via the die saw operation and each dice is attached to a leadframe and is subsequently encapsulated with a plastic molding compound) places a significant amount of stress on the dice. The stress results in sufficient changes in the characteristics of the circuit components to cause the reference voltage levels to shift, thereby widening the distribution and reducing performance and yield.

A solution to the wide distribution caused by the packaging process as well as the fabrication process is to provide trimming capability after packaging. But given the present state of technology, no simple and cost effective means of trimming packaged devices is available. Laser trimming of packaged devices requires ceramic packages with windows, which can be prohibitively costly. Electrical trimming of plastic packages requires the use of such process technologies as EEPROM (Electrically Erasable Programmable Read Only Memory), which is also costly and requires the integration of the complex EEPROM process.

SUMMARY

In accordance with the present invention, from among at least three of reference voltages the median reference voltage is identified.

In one embodiment, a circuit includes: a comparator circuit for performing at least three compare operations, wherein in each compare operation the comparator compares two of at least three reference voltages to one another and provides a signal to indicate which of the two reference voltages is greater; and a decode logic circuit for decoding the signals provided by the comparator circuit in the at least three compare operations to select the median reference voltage from among the at least three reference voltages.

In another embodiment, a multiplexer is coupled to the decode logic circuit wherein the decode logic circuit causes the multiplexer to transfer the median reference voltage to an output terminal of the multiplexer in response to the signals provided by the comparator circuit in the at least three compare operations.

In another embodiment, the comparator circuit performs the at least three compare operations sequentially. Alternatively, the at least three compare operations are performed simultaneously by at least three comparators.

In yet another embodiment, three identically designed bandgap reference circuits are used for generating three reference voltages. A detector circuit detects the time at which a signal Vin drops below a majority of the reference voltages. One application of this embodiment is in devices requiring power-on reset function. In such application, Vin is designed to reflect changes in the power supply voltage, and the three bandgap reference circuits are designed to provide a target reference voltage which corresponds to a supply voltage level below which the device is considered non-operational. During normal device operation, if the device supply voltage drops below the tolerated voltage level, Vin drops accordingly. As Vin drops, the time at which Vin drops below a majority of the reference voltages, the detector circuit generates a signal which causes the device to power down.

One feature of the present invention is that if a number of identically designed bandgap reference circuits provide an abnormal distribution of reference voltages due to one or more deviant reference voltages, selection of the reference voltage closest to the target value is not influenced by the deviant reference voltages.

Another feature is that the complications associated with wafer level as well as package level trimming techniques are eliminated.

These and other features and advantages of the present invention will become more apparent from the following description and the accompanying drawings.

DESCRIPTION OF EMBODIMENTS

In accordance with the present invention, from among a group of reference voltages generated by identically designed bandgap reference circuits, the median reference voltage is identified. This approach relies on the assumption that the median reference voltage among a group of reference voltages (having a normal or abnormal distribution) is substantially close to the target reference voltage. Such assumption is quite reasonable given the extent of control that can be exercised over the design and production of bandgap reference circuits.

Figure 2:
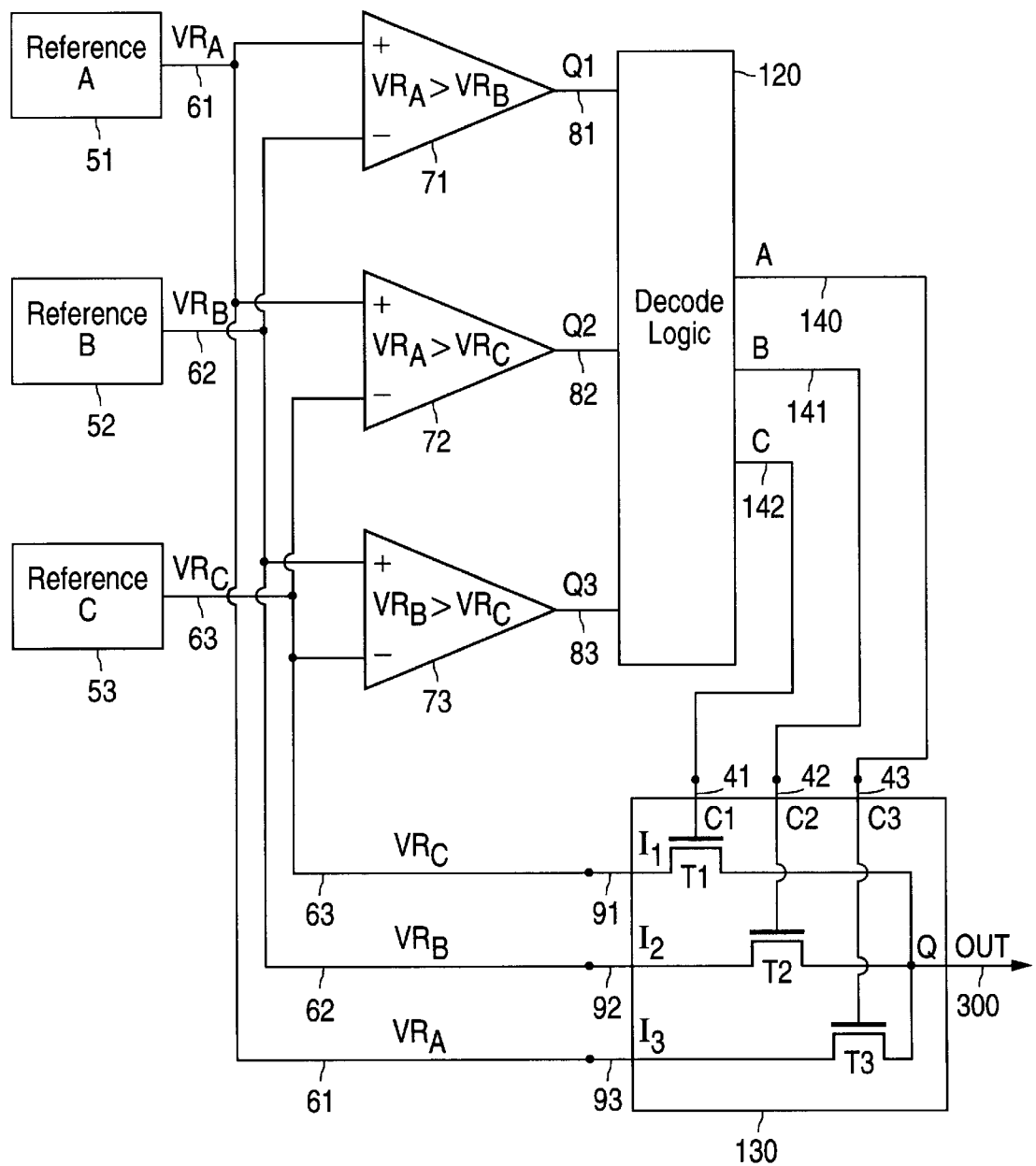
FIG. 2 shows one embodiment of the present invention wherein the median reference voltage is selected from among three reference voltages by simultaneously comparing the three reference voltages with one another using three comparators.

FIG. 2 shows one embodiment of the present invention. Three identically designed bandgap reference circuits 51, 52 and 53 provide the respective reference voltages $VR_A$, $VR_B$ and $VR_C$ on respective leads 61, 62 and 63. Reference voltage $VR_A$ is provided as an input signal to the positive input terminal of comparators 71 and 72; reference voltage $VR_B$ is provided as an input signal to the negative input terminal of comparator 71 and the positive input terminal of comparator 73; and reference voltage $VR_C$ is provided as an input signal to the negative input terminal of comparators 72 and 73.

Comparators 71, 72 and 73 provide the respective output signals Q1, Q2 and Q3 on respective leads 81, 82 and 83. Output signals Q1–Q3 are provided as input signals to the decode logic block 120. The decode logic 120 in turn provides output signals A, B and C on respective leads 140, 141 and 142.

Multiplexer (mux) 130 receives reference voltages $VR_A$, $VR_B$ and $VR_C$ at its respective input terminals 91, 92 and 93. Mux 130 also receives the signals A, B and C at its control input terminals 41, 42 and 43, respectively, and provides the output signal OUT on its output terminal 300. Mux 130 is a conventional three to one mux which provides one of the three reference voltages $VR_A$, $VR_B$ and $VR_C$ at its output terminal 300 depending upon which of the three transistors T1, T2 and T3 is turned on by signals A, B and C.

The operation of the circuit of FIG. 2 will be described using Table 1. The left three columns in Table 1 show the eight possible binary combinations of the three output signals Q1, Q2 and Q3. The right three columns show the state of each of the three output signals A, B and C for each binary combination of signals Q1–Q3. For a give set of $VR_A$, $VR_B$ and $VR_C$, this Table indicates which is the median reference voltage.

Each entry in the left three columns indicates whether a specific condition (shown as an algebraic equation at top of each column) is met. For example, the 0's in the left most column indicate that the condition that $VR_A$ is greater than $VR_B$ is not met (i.e., $VR_A$ is less than or equal to $VR_B$). Conversely, the 1's in the left most column indicate that the condition that $VR_A$ is greater than $VR_B$ is met. Similarly, the entries in the second and third columns indicate whether the condition shown as the algebraic equation at top of the respective columns is met.

Each row of entries on the left side of the table corresponds to a particular combination of the reference voltages $VR_A$, $VR_B$ and $VR_C$. For example, the first row corresponds to the case wherein $VRC>VR_B>VR_A$. In this combination, $VR_B$ is the median voltage. This is indicated on the right side of the table by entering a "1" for signal B and a "0" for each of signals A and C. As another example, the fourth row corresponds to the case wherein $VR_B>VR_A>VR_C$, and thus $VR_A$ is the median voltage. This is indicated on the right side of the table by entering a "1" for signal A and a "0" for each of signals B and C.

In Table 1, no entries are provided for signals A–C in the third and sixth rows. This is because the binary combination of signals Q1–Q3 in the third and sixth rows are impossible to occur. For example, the third row represents the impossible combination of $VR_B$ being greater than $VR_A$, $VR_A$ being greater than $VR_C$, and $VR_C$ being greater than $VR_B$.

The decode logic block 120 in FIG. 2 represents the logic implementation of the truth Table 1. Therefore, for each valid combination of its input signals Q1–Q3, logic block 120 drives only one of its output signals A–C high. The high signal in turn turns on the corresponding NMOS transistor in mux 130. For example, the Q1–Q3 signal combination of the first row in Table 1 results in signal B going high, which in turn turns on transistor T2. With transistor T2 turned on, the $VR_B$ signal is provided on the output lead 300. The output lead 300 is routed to circuits (not shown) using the bandgap reference voltage.

Figure 3:
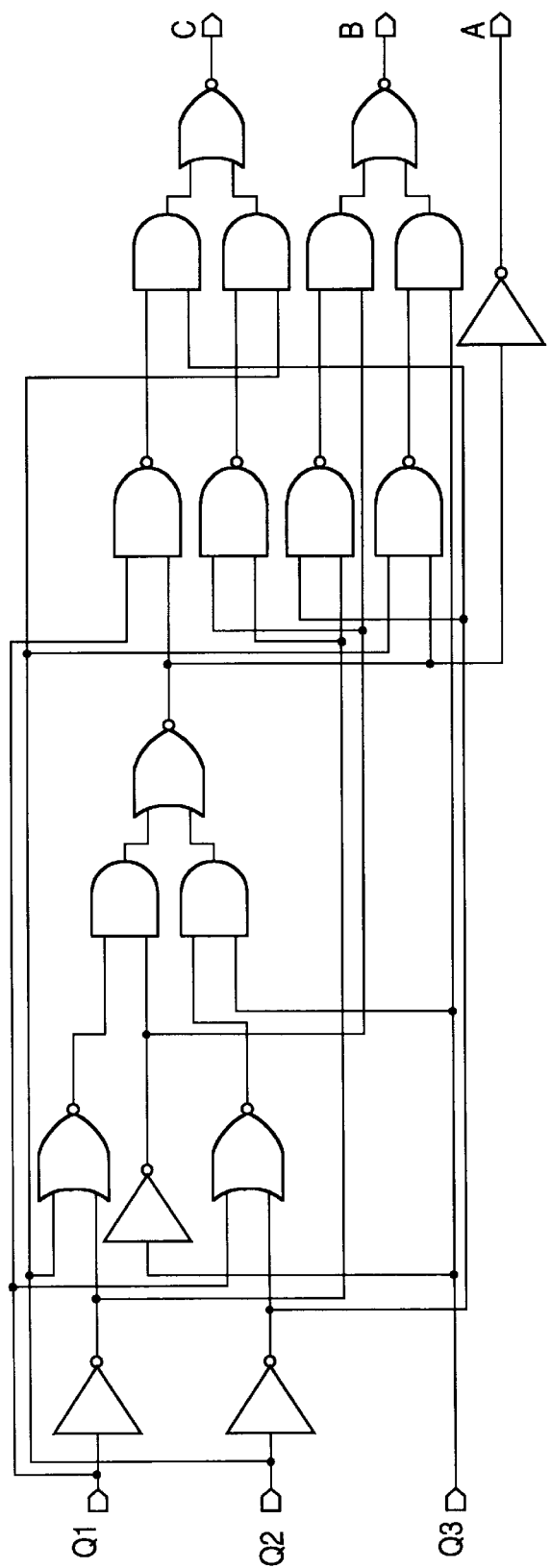
FIG. 3 shows one possible logic implementation of the decode logic block 120 in FIG. 2.

To ensure accurate operation of circuit of FIG. 2, it is important that the comparators 71–73 are adjusted to eliminate any offset differences between them. Zeroing techniques may be used to eliminate such offset differences. The circuit of FIG. 2 is not limited to any specific circuit implementation of the bandgap reference circuits 51–53, the comparator blocks 71–73, the multiplexer 130 or the decoder logic block 120. FIG. 3 shows one logic implementation of the decode logic block 120, though other implementations are possible. The operation of this logic circuit will not be described, suffice it to state that this circuit drives one of its three output signals A–C high for each valid combination of Q1–Q3 signals received at its input terminals.

Figure 4:
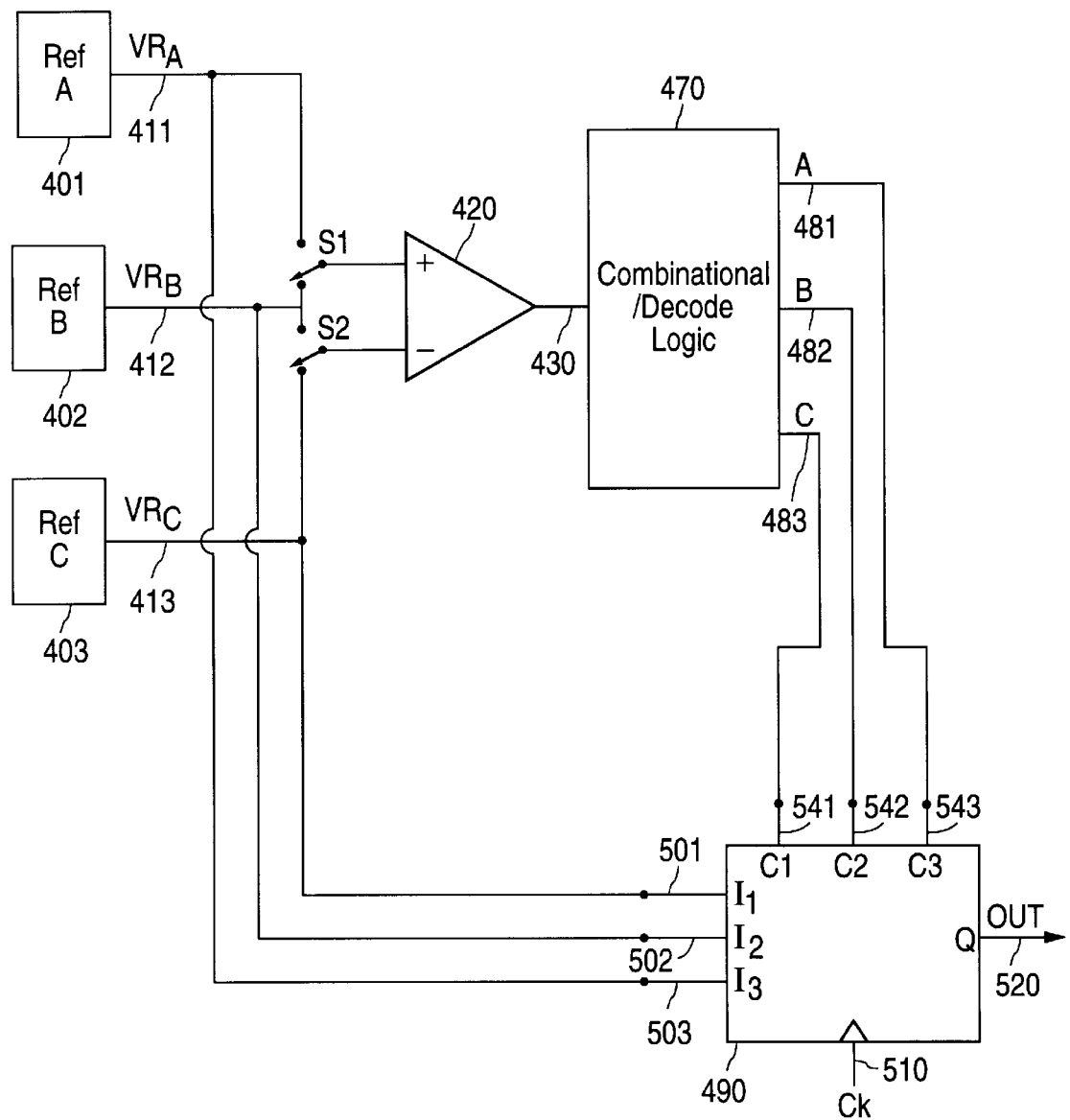
FIG. 4 shows another embodiment of the present invention wherein the median reference voltage is selected from among three reference voltages by sequentially comparing the three reference voltages with one another using one comparator.

FIG. 4 shows another embodiment of the present invention. Identically designed bandgap reference circuits 401, 402 and 403 provide reference voltages $VR_A$, $VR_B$ and $VR_C$ on respective leads 411, 412 and 413. Leads 411 and 412 are connectable to the positive input terminal of comparator 420 via switch S1. Leads 412 and 413 are connectable to the negative input terminal of comparator 420 via switch S2. The output terminal 430 of comparator 420 is provided to the combinational/decode logic block 470. The mux 490 is connected to block 470 and the reference circuits 401–403 similar to mux 130 of FIG. 2 (with a exception that mux 490 may also receive the clock signal CK on the input terminal 510).

The general principle behind the operation of circuit of FIG. 4 is similar to that of FIG. 2. As such, the truth Table 1 also applies to the circuit of FIG. 4. The operation of this circuit is as follows. In a sequence of comparisons performed by the comparator 420, the reference voltages $VR_A$, $VR_B$ and $VR_C$ are compared to one another and the results are provided to the combinational/decode logic block 470. Block 470 in turn drives one of its three output signals A, B and C on the respective output terminals 481, 482 and 483 to a high state. Depending upon which of the signals A–C is asserted high, the mux 490 provides one of the reference voltages $VR_A$–$VR_C$ on its output terminal 520.

This embodiment provides the following advantages over that of FIG. 2: (1) reduce the number of comparators, thereby reduce the total silicon area consumed (although some area is lost due to the additional combinational logic needed in block 470), and (2) with a single comparator, offset differences between comparators is not a concern.

Note that the median reference voltage selection implemented by the above two embodiments is self-activating, i.e., every time the device is powered up, the median reference voltage is automatically selected as described above. As such, in the face of reference voltage drifts caused by aging or die stress in the assembly process, it is always guaranteed that the median reference voltage will automatically be selected. Also, external or internally generated clocks, or other techniques, may be used to implement periodic selection of median reference voltage if the device is maintained in the on state for extended periods of time.

Further, the self-activating feature of the present invention ensures that the median reference voltage is selected regardless of any changes in the reference voltages over the supply voltage range. For example, if among reference voltages $VR_1$, $VR_2$, and $VR_3$, the median reference voltage at 4.5 V supply voltage is $VR_1$ and at 5.5 V is $VR_2$, that $VR_1$ and $VR_2$ are automatically selected as the median reference voltages at the respective supply voltages. It is however required that the device be powered down and powered back up when the supply voltage is changed. Alternatively, periodic median voltage detection can be used, as discussed above, to eliminate the need for turning the device on and off.

Figure 5:
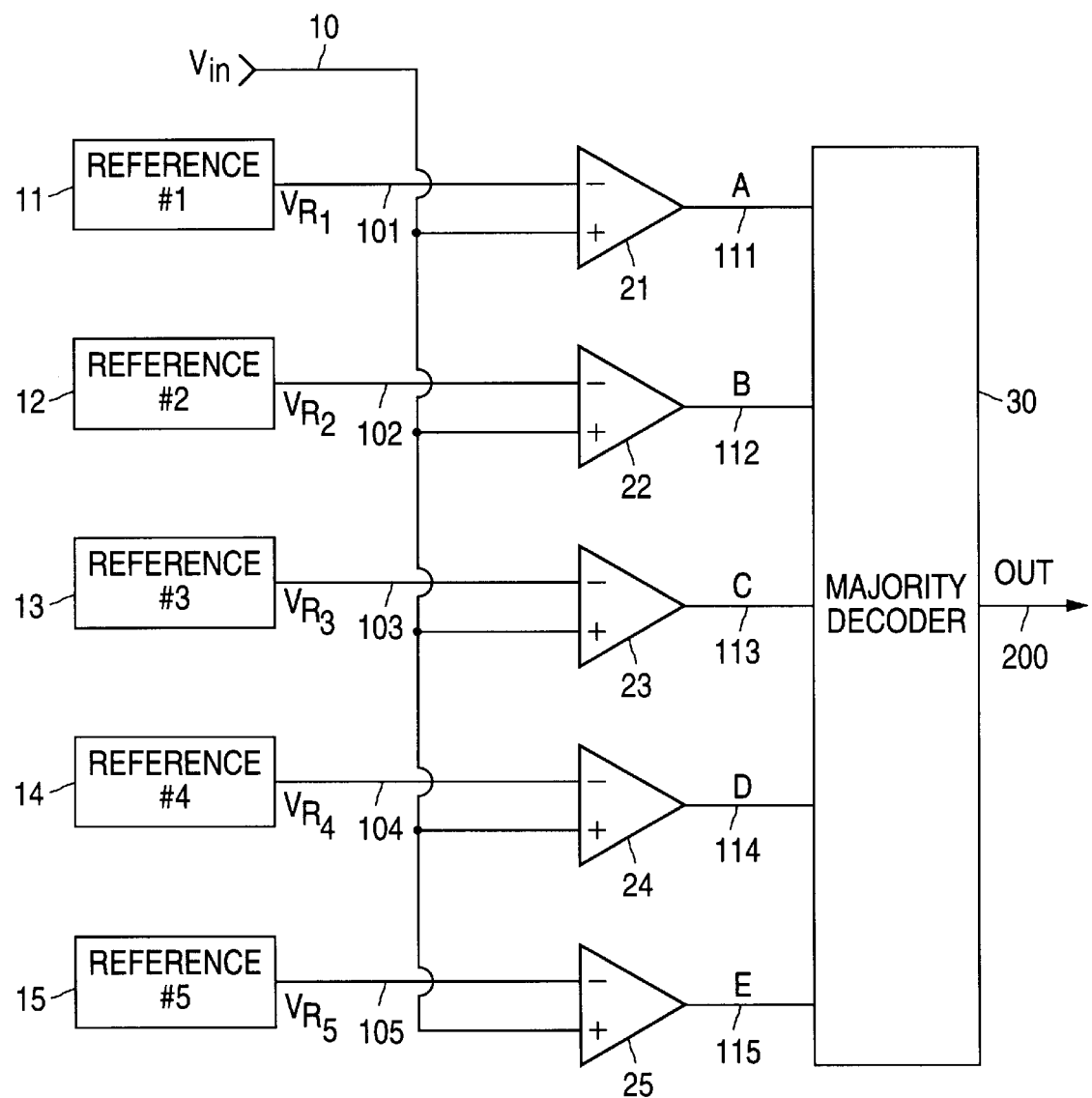
FIG. 5 shows another embodiment of the present invention wherein a detector circuit detects the time at which a signal Vin drops below a majority of five reference voltages.

FIG. 5 shows another embodiment. The circuit in FIG. 5 detects the time at which a relatively slow moving input signal vin on lead 10 goes above or below a reference voltage, and generates a corresponding output signal OUT on lead 200. One goal of this circuit is to ensure that the changes in the output signal OUT is in response to changes in Vin as compared to a reference voltage value which substantially equals a target value ("target value" refers to the reference voltage value which a bandgap reference circuit is designed to provide). Achieving this goal is made difficult by such factors as process variations and the packaging process which cause the reference voltage to randomly drift from the target value, as discussed above.

Figure 1A:
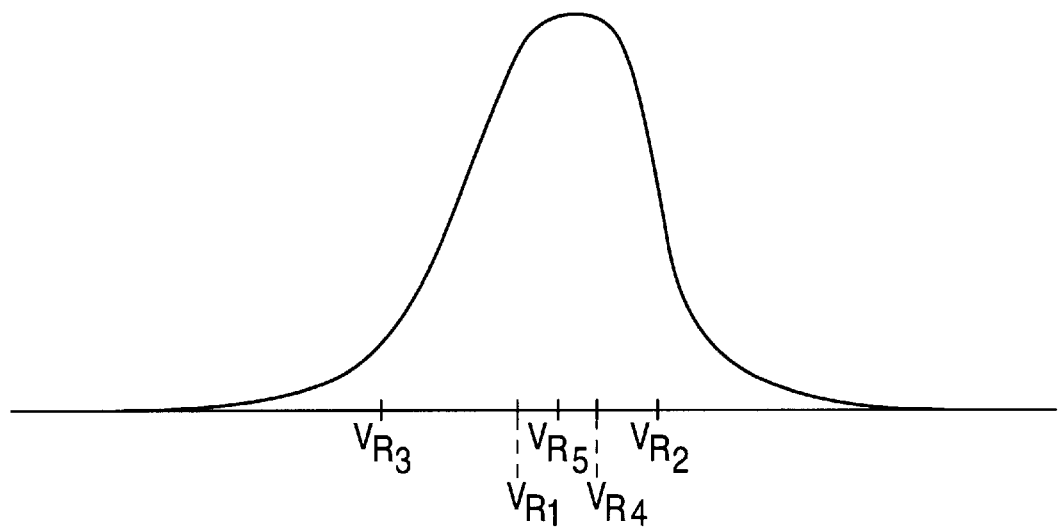
FIG. 1a shows a normal distribution among five reference voltages generated by five identically designed bandgap reference circuits.
Figure 1B:
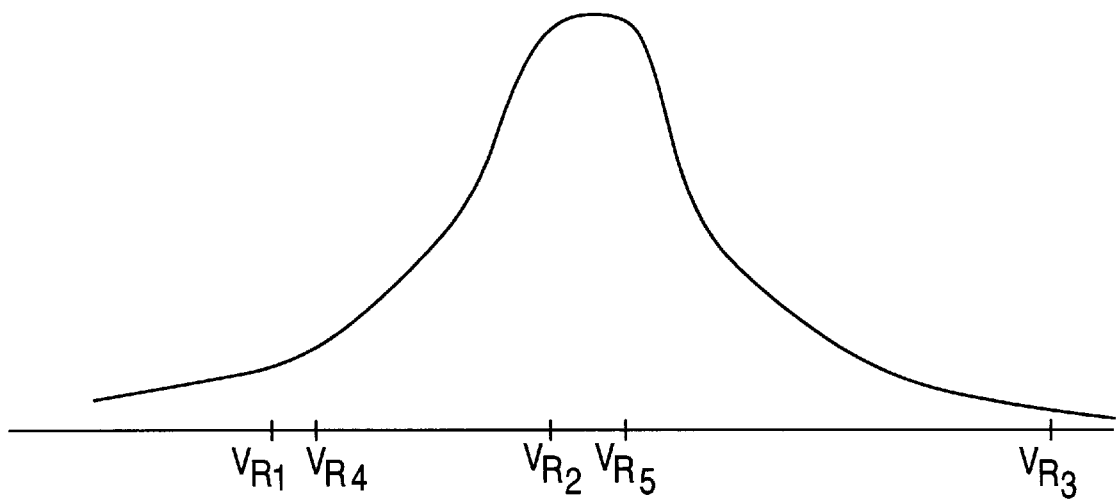
FIG. 1b shows a distribution among five reference voltages generated by five identically designed bandgap reference circuits wherein the number of reference voltages in the tails of the distribution (deviant reference voltages) is greater than that expected with a normal distribution.

To achieve this goal, five identically designed bandgap reference circuits 11–15 are used to provide a distribution (which may be normal as in FIG. 1a or abnormal as in FIG. 1b) around the target reference voltage value. The circuit of FIG. 5 causes the output signal OUT to change in response to changes in Vin as compared to the "median" reference voltage ("median" refers to the center reference voltage among the five reference voltages).

In FIG. 5, the bandgap reference circuit 11 provides a reference voltage $VR_1$ on lead 101. Comparator 21 receives $VR_1$ at its negative input terminal. Four other bandgap reference circuits 12, 13, 14 and 15 are connected to the respective comparators 22, 23, 24 and 25 in a similar manner. Each of the comparators 21–25 receives the Vin signal at its positive input terminal. Each of the comparators 21–25 provides a respective output signal A, B, C, D and E on respective leads 111, 112, 113, 114 and 115. A majority decoder circuit 30 receives the output signals A–E and provides an output signal OUT on output terminal 200.

Figure 6:
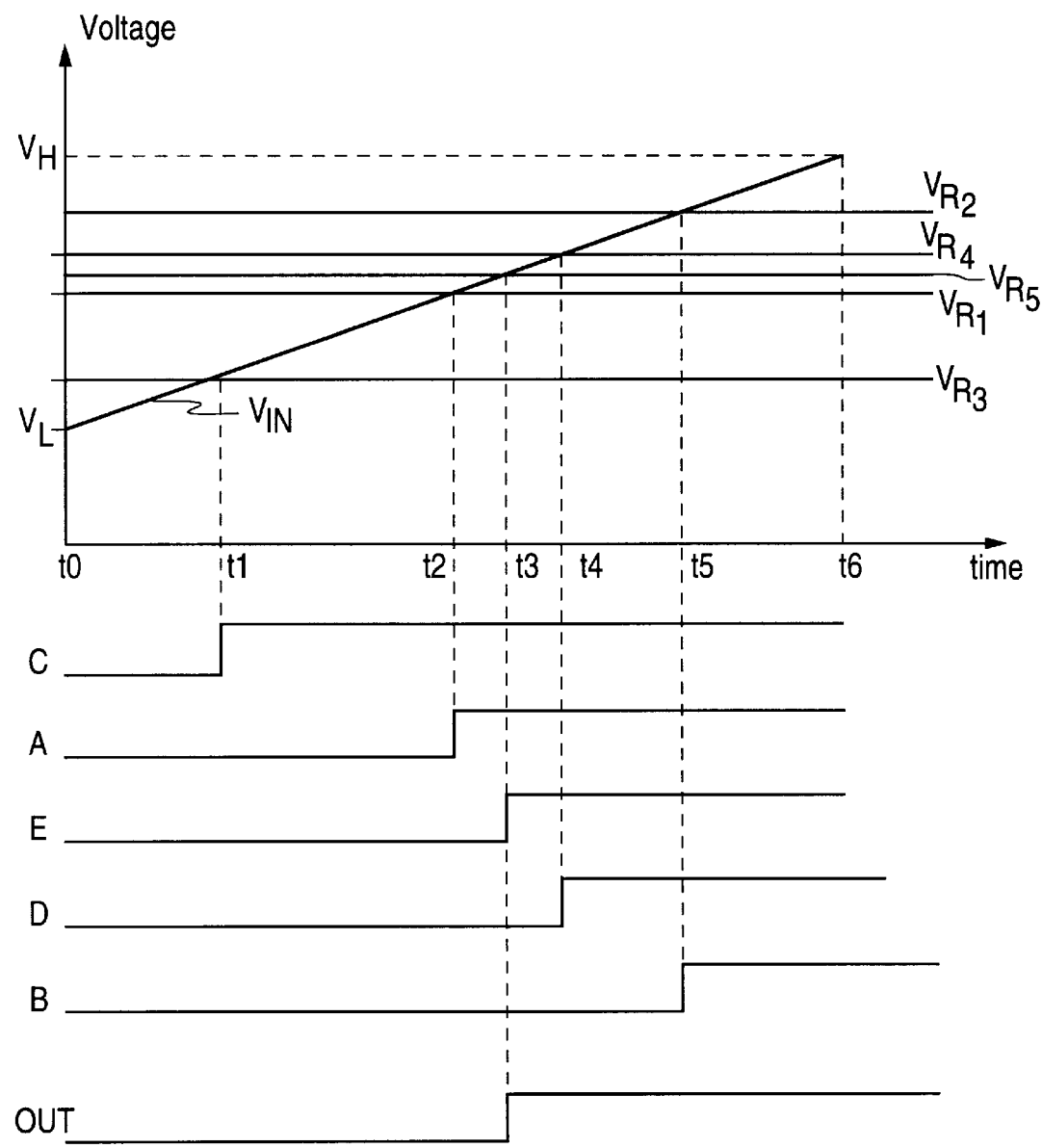
FIG. 6 shows a sample timing diagram provided for the limited purpose of describing the operation of circuit of FIG. 5.
Figures 8, 9:
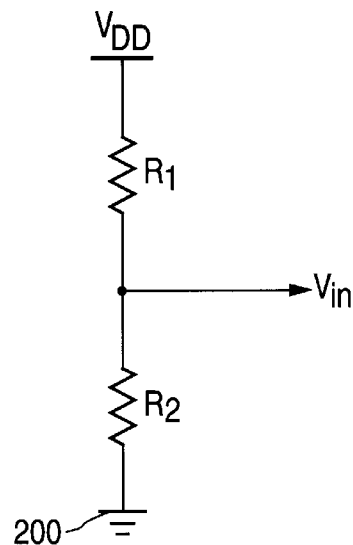
FIG. 8 shows a resistor divider used in conjunction with the circuit of FIG. 5 to implement a power-on reset function.
FIG. 9 is a truth table showing the possible bit combinations at the three output terminals A, B and C of each of the blocks 120 and 470 in the respective FIGS. 2 and 4 for each of the six possible arrangements of the three reference voltages $VR_A$, $VR_B$ and $VR_C$.

FIG. 6 shows a timing diagram which is provided as an example for the limited purpose of illustrating the operation of the circuit of FIG. 5. The upper portion of FIG. 6 shows the input signal Vin and the five reference voltages $VR_1$–$VR_5$ over time. The voltage levels $VR_1$–$VR_5$ correspond to those in FIG. 1a and as such reflect the normal distribution shown in FIG. 1a (note however, that the circuit of FIG. 5 is just as effective with reference voltage levels corresponding to abnormal distributions such as that shown in FIG. 1b; in fact, salvaging devices with abnormal distributions is one of the goals of this circuit). The lower portion of FIG. 6 shows signals A–E and OUT over time. The input signal Vin is shown to ramp up over time, although it could also move in a random manner.

Each of the comparators 21–25 compares the incoming Vin signal with the corresponding steady state reference voltage and provides a low signal on its output terminal if the Vin signal is lower than the corresponding reference voltage, and a high signal in the opposite case. For the circuit of FIG. 5 to operate accurately, any offset differences between comparators 21–25 need to be eliminated.

In FIG. 6, prior to time $t_1$ signal Vin is lower than all reference voltages $VR_1$–$VR_5$, and therefore the output signals A–E are low. As the Vin signal rises, it crosses each of $VR_3$, $VR_1$, $VR_5$, $VR_4$ and $VR_2$ at respective times $t_1$, $t_2$, $t_3$, $t_4$ and $t_5$, causing the output signals C, A, E, D, and B to go high accordingly.

At time $t_3$, Vin rises above $VR_5$ which causes signal E to go high. At this time, signal E along with output signals A and C make up a majority of the output signals A–E that are in the high state. In response, the majority decoder block 30 drives its output terminal 200 high. In this manner, the median reference voltage $VR_5$ among the five reference voltages causes the output signal OUT to make a transition.

The number of bandgap reference circuits used in FIG. 5 is illustrative only. Generally, an odd number of reference circuits is preferred to allow detection of a majority by the majority decoder 30. Also, using a larger number of reference circuits increases the probability that the median reference voltage is closer to the target value, however, a larger amount of silicon area is consumed.

Generally, the principle that the circuit of FIG. 5 demonstrates is the use of multiple references to obtain a composite reference value which is closer to the target value than if only one reference circuit was used.

Figure 7:
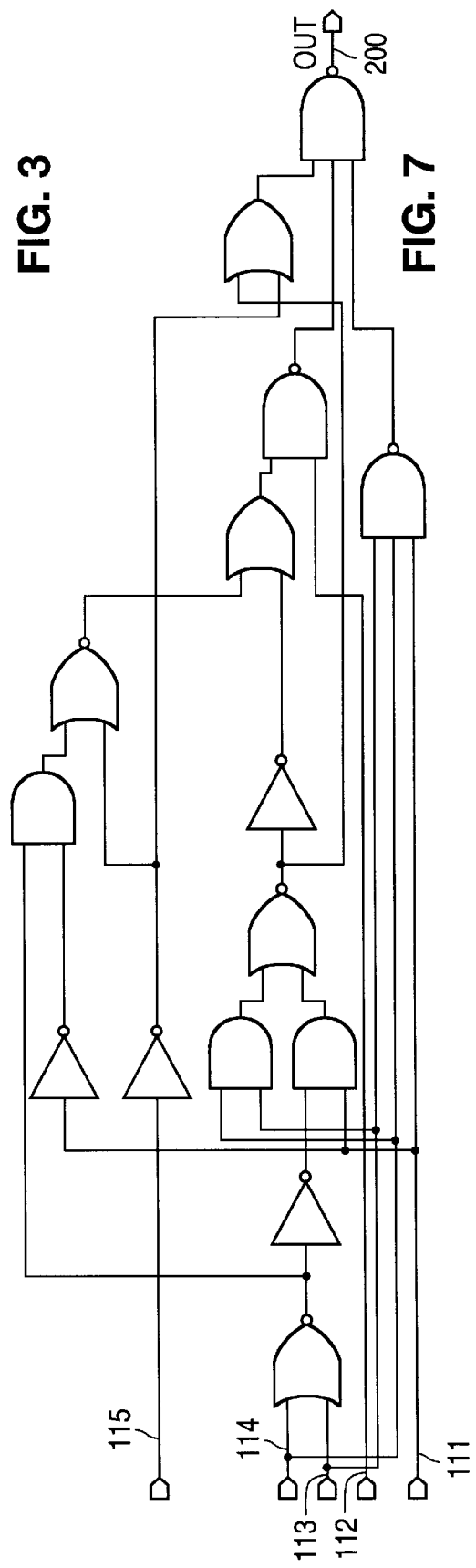
FIG. 7 shows one possible logic implementation of the majority decoder block 30 in FIG. 5.

FIG. 7 shows one possible logic implementation of the majority decoder 30 in FIG. 5. The operation of this circuit will not be described, suffice it to state that the logic circuit of FIG. 7 receives the comparator output signals A–E on input leads 112, 111, 113, 114, and 115 respectively, and generates a low to high transition on the output terminal 200 when a majority of the signals A–E make a low to high transition.

One application of the circuits in FIGS. 5 and 7 is in devices requiring a power-on reset function. Power-on reset circuits are generally used: (1) to ensure that upon power-up a device is not activated until the device supply voltage reaches a high enough value at which the device is operational, and (2) to deactivate the device during normal operation if the device supply voltage drops below a level under which the operation of the device is not guaranteed (the drop in supply voltage during normal operation may be caused by such inadvertent occurrences as large supply current surges).

In such application, the signal Vin is derived from a voltage divider circuit, as shown in FIG. 7. Two serially connected resistors R1 and R2 of predetermined values are connected between the device power supply VDD and the ground terminal 200. For illustration purposes, it is assumed that the power supply voltage VDD is at 3 V when the device is fully powered up, that the device is to power down if VDD drops below 2.5 V, and that resistors R1 and R2 are equal such that Vin would be at the mid-voltage level between VDD and the ground potential at all times (for example, when the device is fully powered up to 3 V, Vin would be at 1.5 V). Accordingly, the reference circuits 11–15 in FIG. 5 are designed to generate the target voltage of 1.25 V, so that when VDD goes below 2.5, Vin goes below 1.25 V causing the device to power down. In FIG. 5, the output signal OUT would be used to power up or power down the device.

As discussed earlier, although the five bandgap reference circuits 11–15 are designed identically, after fabrication and package assembly, they provide a distribution (which may be normal as in FIG. 1a or abnormal as in FIG. 1b) around the target reference voltage 1.25 V.

In the case of powering up the device, whereby VDD is ramped up, Vin would follow at half VDD level. Assuming that the Vin signal in FIG. 6 corresponds to such ramp-up, the operation of circuit 5 will be as described above. As such, just immediately after time $t_3$, when Vin is greater than a majority of the reference voltages, signal OUT goes high causing the device to power up. Thus, the device is powered up in response to Vin reaching the median reference voltage $VR_5$. In this manner, it is ensured that of the five reference voltages, the one which is closest to the 1.25 V target voltage level causes the device power up.

In the case of the power supply voltage VDD dropping below the tolerated 2.5 V level during normal operation, the circuit of FIG. 5 operates in a similar manner. During normal operation, VDD is at 3 V, Vin is at 1.5 V which is above all reference voltages $VR_1$–$VR_5$ (reference voltages $VR_1$–$VR_5$ are presumably distributed around the 1.25 V target level in the order shown in FIG. 6), and signal OUT is high maintaining the device in the power up state. Upon VDD dropping from 3 V to below 2.5 V, Vin drops from 1.5 V to below 1.25 V. As Vin drops from 1.5 V, the output signal OUT changes to a low state as soon as Vin goes below a majority of the reference voltages $VR_1$–$VR_5$. Accordingly, signal OUT goes low when Vin goes below the median reference voltage $VR_5$, causing the device to power down. Once again, in this manner, it is guaranteed that out of an odd number of reference voltages, the median reference voltage ($VR_5$) which is closest to the target voltage level (1.25 V), will cause the device to power down.

The above description of the present invention is intended to be illustrative and not limiting. The invention is further intended to include all variations and modifications falling within the scope of the appended claims.

What is claimed is:

1. A circuit comprising:
   a comparative circuit for performing at least three compare operations, wherein in each compare operation the comparator compares two of at least three reference voltages to one another and provides a logic signal to indicate which of the two reference voltages is greater; and
   a decode and select circuit for decoding the logic signals provided by the comparator circuit in the at least three compare operations and for selecting the median reference voltage from among the at least three reference voltages.

2. Circuit of claim 1 wherein the logic signal is either a logic high or a logic low signal.

3. Circuit of claim 1 wherein the decode and select circuit comprises:
   a decode circuit for providing decoded logic signals in response to the logic signals provided by the comparator circuit in the at least three compare operations; and
   a multiplexer for transferring the median reference voltage to an output terminal of the multiplexer in response to the decoded logic signals.

4. Circuit of claim 1 wherein the comparator circuit performs the at least three compare operations sequentially.

5. Circuit of claim 1 wherein the at least three compare operations are performed simultaneously by at least three comparators.

6. Circuit of claim 5 wherein an offset of each of the at least three comparators is eliminated using zeroing circuitry therein.

7. Circuit of claim 1 wherein each of the at least three reference voltages is generated by a bandgap reference voltage generator circuit.

8. Circuit of claim 7 wherein the bandgap reference voltage generator circuits generating the at least three reference voltages are designed identically.

9. Circuit of claim 4 further comprising at least two switches capable of providing any two of the at least three reference voltages to the comparator circuit for comparing.

10. A method for detecting a median reference voltage, comprising the steps of:

performing at least three compare operations, wherein in each compare operation two of at least three reference voltages are compared to one another;

in each of the at least three compare operations, providing a logic signal to indicate which of the two reference voltages is greater;

decoding the logic signals provided in the at least three compare operations; and selecting the median reference voltage from among the at least three reference voltages based on the decoded logic signals.

11. Method of claim 10 wherein the logic signal is either a logic high or a logic low signal.

12. Method of claim 10 wherein the at least three compare operations are performed sequentially.

13. Method of claim 10 wherein the at least three compare operations are performed simultaneously.

* * * * *